United States Patent
Goren et al.

(10) Patent No.: US 6,566,934 B1
(45) Date of Patent: May 20, 2003

(54) CHARGE CANCELLATION CIRCUIT FOR SWITCHED CAPACITOR APPLICATIONS

(75) Inventors: David Goren, Nesher (IL); Israel Wagner, Haifa (IL); Eliyahu Shamsaev, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/029,980

(22) Filed: Dec. 31, 2001

(51) Int. Cl.[7] ................................................ G06F 7/64
(52) U.S. Cl. ........................................ 327/337; 327/382
(58) Field of Search ............................ 327/91, 94, 337, 327/382, 383, 384, 389, 391, 554

(56) References Cited

U.S. PATENT DOCUMENTS

| | | | |
|---|---|---|---|
| 4,794,333 A | | 12/1988 | Milkovic |
| 5,479,121 A | | 12/1995 | Shen et al. |
| 5,825,230 A | * | 10/1998 | Chen et al. .................. 327/337 |
| 5,905,397 A | * | 5/1999 | Koifman et al. ............. 327/337 |
| 6,072,355 A | * | 6/2000 | Bledsoe ........................ 326/88 |
| 6,323,697 B1 | * | 11/2001 | Pavan .......................... 327/91 |

OTHER PUBLICATIONS

R.J. Baker et al, CMOS Circuit Design, Layout , and Simulation, IEEE Press Series on Microelectronic Systems, IEEE Press, New York, 1998, pp. 722–723.

Behzad Razavi, Design of Analog CMOS Integrated Circuits, McGraw–Hill Companies, 2000, pp. 401–407.

Je–Hurn Shieh et al, "Measurement and Analysis of Charge Injection in MOS Analog Switches", IEEE Journal of Solid–State Circuits, vol. SC–22, No. 2, Apr. 1987, pp. 277–281.

Christoph Eichenberger and Walter Guggenbuhl, "On Charge Injection in Analog MOS Switches and Dummy Switch Compensation Techniques", IEEE Transactions on Circuit and Systems, vol. 37, No. 2, Feb. 1990. pp. 256–264.

M.–J. Chen et al, "New Observation of Charge Injection in MOS Analogue Switches", Electronics Letters Online No.:19940177, IEEE 1994.

* cited by examiner

Primary Examiner—My-Trang Nuton
(74) Attorney, Agent, or Firm—Browdy and Neimark, P.L.L.C.

(57) ABSTRACT

A switched capacitor circuit, including a load-capacitor, and a charging switch which is coupled to apply a potential to the load-capacitor. The circuit further includes a compensating-capacitor and switching circuitry which is coupled to the charging switch and the compensating-capacitor and which is switchable. The switching is arranged to transfer to the compensating-capacitor an injection error charge produced by the charging switch, and then to isolate the injection error charge on the compensating-capacitor from the load-capacitor.

34 Claims, 6 Drawing Sheets

CHARGE CANCELLATION CIRCUIT FOR SWITCHED CAPACITOR APPLICATIONS

FIELD OF THE INVENTION

The present invention relates generally to electronic circuits, and specifically to switching capacitor circuits.

BACKGROUND OF THE INVENTION

Switched capacitors are one of the basic building blocks in analog circuitry. A switch, which couples a potential to a capacitor, closes to charge the capacitor to the potential. The switch then opens so that the charge remains on the capacitor. Typically, the switch is implemented from one or more transistors, such as metal oxide semiconductor (MOS) transistors. In this case, as the switch opens, there is a transfer of charge from the transistor to the capacitor. The charge transfer is caused by a combination of charge injection and clock feed-through. Charge injection is the charge in the channel of the transistor dissipating by leakage to the drain and/or the source of the transistor. Clock feed-through is the charge induced by the parasitic capacitance of the gate-diffusion overlap. Hereinbelow the combination is referred to by the single term "charge injection." As accuracy requirements for circuits become more stringent, the effect of charge injection error becomes correspondingly more problematic.

Figure 1:
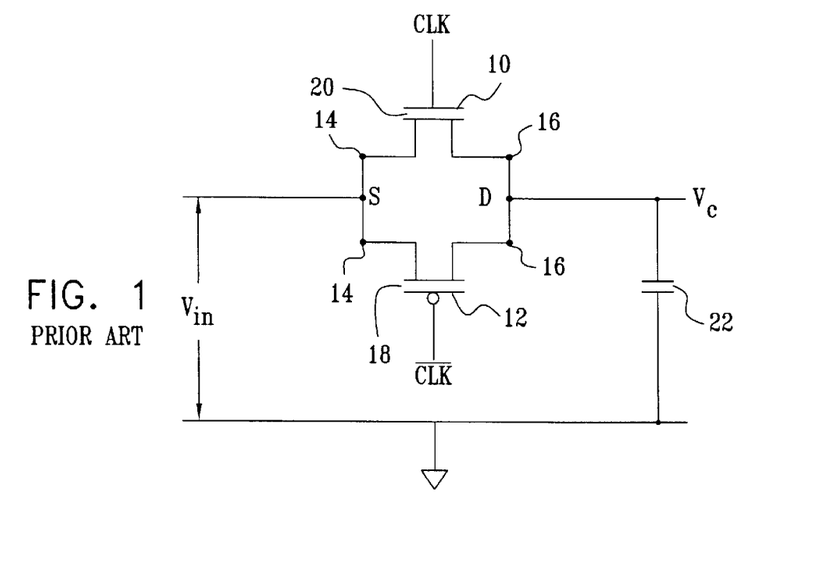
FIG. 1 is a schematic diagram of a circuit for reducing charge injection error, as is known in the art.

FIG. 1 is a schematic diagram of a circuit for reducing charge injection error, as is known in the art. The circuit comprises an n-channel MOS (NMOS) transistor 10 and a p-channel MOS (PMOS) transistor 12. Transistors 10 and 12 are coupled in parallel, with sources 14 connecting to each other, and drains 16 also connecting to each other. Transistor 10 is switched off by a CLK signal coupled to the gate of the transistor going low; transistor 12 is switched off by an inverse of CLK, coupled to the gate of transistor 12, going high. In this application and in the claims, a pair of NMOS and PMOS transistors coupled in this manner is termed a transmission gate switch. At switch-off time, charges in a channel 18 of transistor 12 and in a channel 20 of transistor 10 dissipate, as described above. Because the charges are opposite (since the majority carriers on transistor 10 are electrons and the majority carriers on transistor 12 are holes), they tend to cancel at dissipation.

The charges on the two transistors at switch-off are a function of a voltage $V_{in}$ input to the transistors, and are also proportional to the areas of the respective gates. As is known in the art, it is possible to set the areas of the gates of each of transistors 10 and 12 so that the two charge injection errors cancel for a specific value of $V_{in}$. The cancellation is only valid to a first approximation, so that although the areas can be set so that the errors cancel for one value of $V_{in}$, at other values of $V_{in}$ there is at best only partial cancellation.

Figure 2:
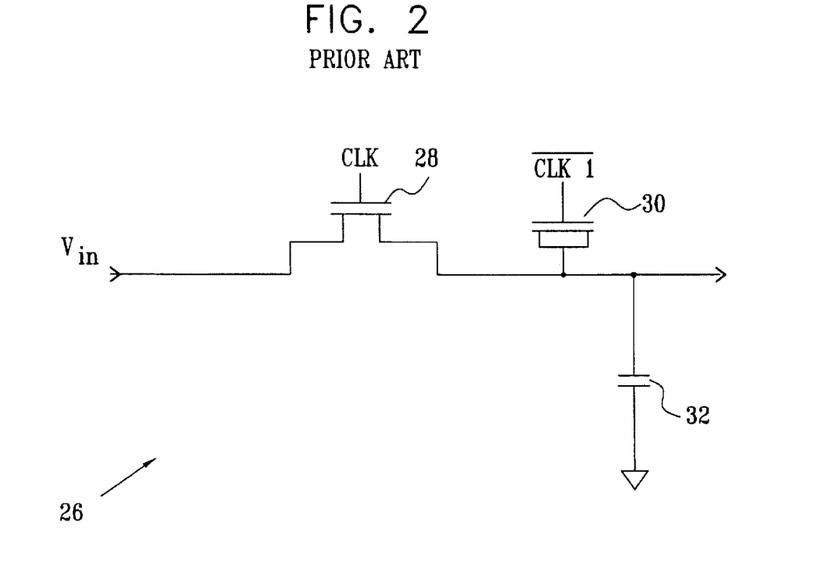
FIG. 2 is a schematic electronic diagram of a circuit 26 for reducing charge injection, as is known in the art.

FIG. 2 is a schematic electronic diagram of a circuit 26 for reducing charge injection, as is known in the art. A description of circuit 26 is given on pages 722 and 723 of *CMOS Circuit Design, Layout, and Simulation* by R. J. Baker et al., published by the IEEE Press, 1998, and is incorporated herein by reference. An NMOS transistor 28 switches, via a clock CLK, a voltage $V_{in}$ charging a capacitor 32. A "dummy" switch 30, formed from a transistor having its drain and source shorted, is coupled to the line connecting transistor 28 to capacitor 32. Switch 30 is clocked by an inverse of CLK. The injection charge formed when transistor 28 switches off charges a capacitor formed by transistor 30 switching on. Unfortunately, optimal operation of circuit 26 is very dependent on the "jitter" between clocks of transistor 28 and transistor 30 being close to zero. Circuits such as those described with reference to FIG. 2, and transmission gate switches such as those described with reference to FIG. 1, can typically reduce injection charge voltage errors to approximately 5 mV for a dynamic input voltage range of the order of 1 V.

U.S. Pat. No. 5,479,121 to Shen et al., whose disclosure is incorporated herein by reference, describes a system for correcting problems caused by injection error charges. The system comprises a compensating circuit which includes an amplifier and two capacitors. A capacitance ratio of the capacitors is chosen so that when they function in combination with the amplifier, injection charge is effectively neutralized. However, the system does not correct the second order effect caused by the dependence of the charge injection error on the value of Vin, and is complicated.

SUMMARY OF THE INVENTION

In preferred embodiments of the present invention, a transmission gate switch receives an input voltage which charges a load capacitor. An output of the transmission gate switch is coupled to a sub-circuit which compensates for charge injection error caused when the transmission gate switch switches off. The sub-circuit comprises switching circuitry having a plurality of switches connected in series, including an isolating switch and a discharge switch. A pole of the isolating switch is coupled to the output of the transmission gate switch. A compensating capacitor is connected in parallel with the discharge switch. The plurality of switches are clocked so that when the injection error charge is generated, the compensating capacitor is coupled to the transmission gate switch and receives the error charges. At a later time, the capacitor is de-coupled from the transmission gate switch by the isolating switch, and is discharged by the discharge switch. The sub-circuit enables both first and second order injection charge errors to be substantially eliminated, so that an error voltage substantially less than 1 mV results over a dynamic input range greater than 1 V.

In some preferred embodiments of the present invention, the transmission gate switch operates in a differential mode, wherein first and second transmission gate switches receive complementary differential voltages. The differential voltages charge respective matched load capacitors. The compensation sub-circuit preferably comprises a first and a second isolating switch, each being connected to a respective output of one of the transmission gate switches. The discharge switch is connected in series to the first and a second isolating switches.

The sub-circuit utilizes a first clock which is an inverse of a clock operating the transmission gate switches. A second clock of the sub-circuit controls the discharge switch, the second clock being in phase with the transmission gate clock but having a different duty cycle. Since the injection charge error of the circuit is relatively insensitive to timing of the discharge, performance of the sub-circuit is substantially unaffected by jitter between the first and second clocks.

In some preferred embodiments of the present invention, the compensating capacitor is not a distinct element of the sub-circuit, but is implemented as a parasitic capacitance of the discharge switch, so that component count of the sub-circuit is reduced.

Preferably, at least some of the switches of the sub-circuit are transmission gate switches. Alternatively, at least some of the switches are single transistors.

There is therefore provided, according to a preferred embodiment of the present invention, a switched capacitor circuit, including:

a load-capacitor;

a charging switch, which is coupled to apply a potential to the load-capacitor;

a compensating-capacitor; and switching circuitry, which is coupled to the charging switch and the compensating-capacitor and is switchable so as to transfer to the compensating-capacitor an injection error charge produced by the charging switch, and then to isolate the injection error charge on the compensating-capacitor from the load-capacitor.

Preferably, the switching circuitry includes an isolation switch which isolates the injection error charge from the load-capacitor.

Preferably, the circuit includes a clock which toggles the charging switch and the isolation switch substantially in anti-phase.

Preferably, the switching circuitry includes a discharge switch which discharges the compensating-capacitor, and the circuit preferably includes a first clock which toggles the charging switch and a second clock which toggles the discharge switch substantially in phase with the charging switch, wherein the second clock has a second duty cycle less than a first duty cycle of the first clock.

Preferably, the charging switch includes a transmission gate switch.

Preferably, the compensating-capacitor includes a parasitic capacitance of the switching circuitry.

Preferably, the charging switch includes a transistor having a gate-capacitance, wherein a compensating-capacitor-capacitance of the compensating-capacitor is substantially equal to half the gate-capacitance of the transistor.

Preferably, the switching circuitry includes at least one transmission gate switch.

Preferably, the switching circuitry includes at least one metal oxide semiconductor (MOS) transistor.

There is further provided, according to a preferred embodiment of the present invention, a method for reducing error in a switched capacitor circuit, including:

coupling a charging switch to apply a potential to a load-capacitor; and switching a compensating-capacitor into electrical communication with the charging switch so as to store on the compensating-capacitor an injection error charge produced by the charging switch, thus isolating the injection error charge from the load-capacitor.

Preferably, switching the compensating-capacitor includes coupling an isolation switch to the charging switch, and isolating the compensating-capacitor from the load-capacitor with the isolation switch.

Preferably, coupling the isolation switch includes toggling the charging switch and the isolation switch substantially in anti-phase.

Preferably, switching the compensating-capacitor includes coupling a discharge switch to the compensating-capacitor, and discharging the compensating-capacitor with the discharge switch.

Further preferably, the method includes toggling the charging switch with a first clock and toggling the discharge switch substantially in phase with the charging switch with a second clock, wherein the second clock has a second duty cycle less than a first duty cycle of the first clock.

Preferably, the compensating-capacitor includes a parasitic capacitance of switching circuitry which is adapted to switch the compensating-capacitor.

Further preferably, the switching circuitry includes at least one transmission gate switch.

Preferably, the switching circuitry includes at least one metal oxide semiconductor (MOS) transistor.

There is further provided, according to a preferred embodiment of the present invention, a differential switched capacitor circuit, including:

a first load-capacitor;

a first charging switch, which is coupled to apply a first differential potential to the first load-capacitor;

a second load-capacitor;

a second charging switch, which is coupled to apply a second differential potential to the second load-capacitor;

a compensating-capacitor; and switching circuitry, which is coupled to the first charging switch and the second charging switch and the compensating-capacitor, and is switchable so as to transfer to the compensating-capacitor a first injection error charge produced by the first charging switch and a second injection error charge produced by the second charging switch, and then to isolate the first injection error charge and the second injection error charge on the compensating-capacitor from the first and second load-capacitors.

Preferably, the switching circuitry includes a plurality of isolation switches which isolate the first and second injection error charges from the first and second load-capacitors.

Further preferably, the circuit includes a clock which toggles the first and second charging switches substantially in anti-phase to the plurality of isolation switches.

Preferably, the switching circuitry includes a discharge switch which discharges the compensating-capacitor.

Further preferably, the circuit includes a first clock which toggles the first and second charging switches and a second clock which toggles the discharge switch substantially in phase with the first and second charging switches, wherein the second clock has a second duty cycle less than a first duty cycle of the first clock.

Preferably, at least one of the first and second charging switches includes a transmission gate switch.

Preferably, the compensating-capacitor includes a parasitic capacitance of the switching circuitry.

Preferably, at least one of the first and second charging switches includes a transistor having a gate-capacitance, wherein a compensating-capacitor-capacitance of the compensating-capacitor is substantially equal to half the gate-capacitance of the transistor.

Preferably, the switching circuitry includes at least one transmission gate switch.

Preferably, the switching circuitry includes at least one metal oxide semiconductor (MOS) transistor.

Preferably, the first and second injection error charges are substantially equal in magnitude.

Further preferably, the first and the second differential potential are substantially equal in magnitude, and the magnitude of the first and the second differential potential includes a value between 0 V and a predetermined function of one or more rail voltages supplying the circuit.

There is further provided, according to a preferred embodiment of the present invention, a method for reducing error in a differential switched capacitor circuit, including:

coupling a first charging switch to apply a first differential potential to a first load-capacitor;

coupling a second charging switch to apply a second differential potential to a second load-capacitor; and switching a compensating-capacitor into electrical communication with the first and second charging switches so as to store on the compensating-capacitor a first injection error charge produced by the first charging switch and a second injection error charge produced by the second charging switch, thus isolating the first and second injection error charges from the first and second load-capacitors.

Preferably, switching the compensating-capacitor includes isolating the first and second injection error charges from the first and second load-capacitors with a plurality of isolation switches.

Further preferably, isolating the first and second injection error charges includes toggling the first and second charging switches substantially in anti-phase to the plurality of isolation switches.

Preferably, switching the compensating-capacitor includes coupling a discharge switch to the compensating-capacitor and discharging the compensating-capacitor with the discharge switch.

Preferably, the method includes toggling the first and second charging switches with a first clock and toggling the discharge switch substantially in phase with the first and second charging switches with a second clock, wherein the second clock has a second duty cycle less than a first duty cycle of the first clock.

Preferably, the compensating-capacitor includes a parasitic capacitance of switching circuitry which is adapted to switch the compensating-capacitor.

Further preferably, the switching circuitry includes at least one transmission gate switch.

Preferably, the switching circuitry includes at least one metal oxide semiconductor (MOS) transistor.

Preferably, the first and second injection error charges are substantially equal in magnitude.

Further preferably, the first and the second differential potential are substantially equal in magnitude, wherein the magnitude of the first and the second differential potential includes a value between 0 V and a predetermined function of one or more rail voltages supplying the circuit.

The present invention will be more fully understood from the following detailed description of the preferred embodiments thereof, taken together with the drawings, in which:

DETAILED DESCRIPTION OF PREFERRED EMBODIMENTS

Figure 3:
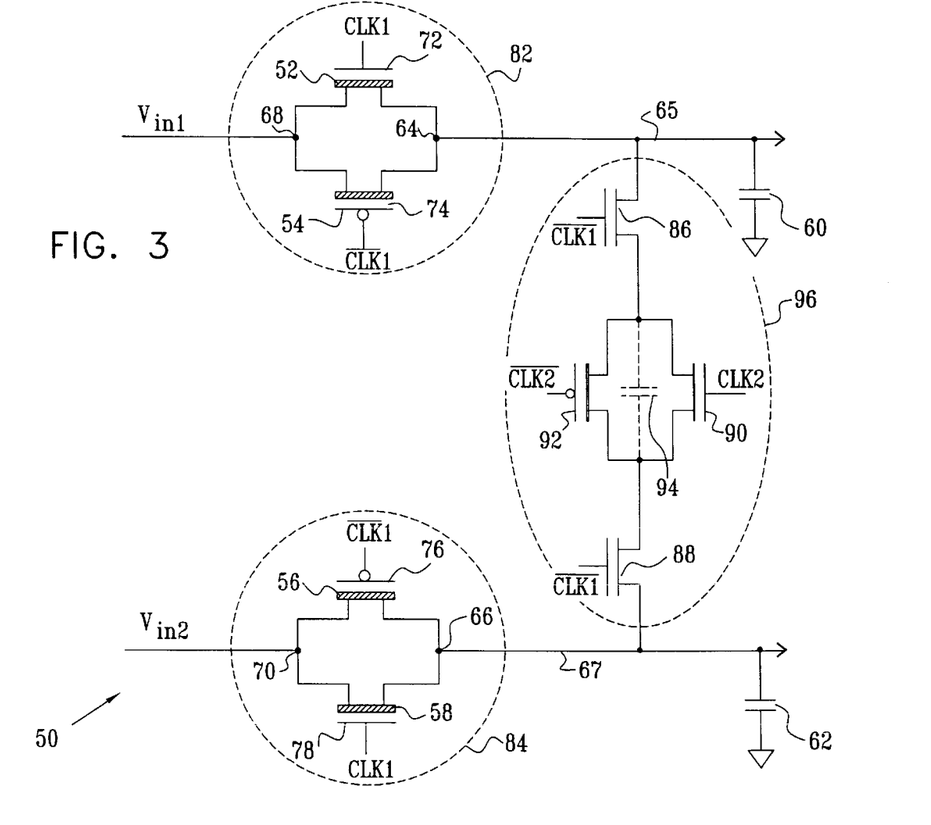
FIG. 3 is a schematic electronic diagram of a switched capacitor circuit, according to a preferred embodiment of the present invention.
Figure 4:
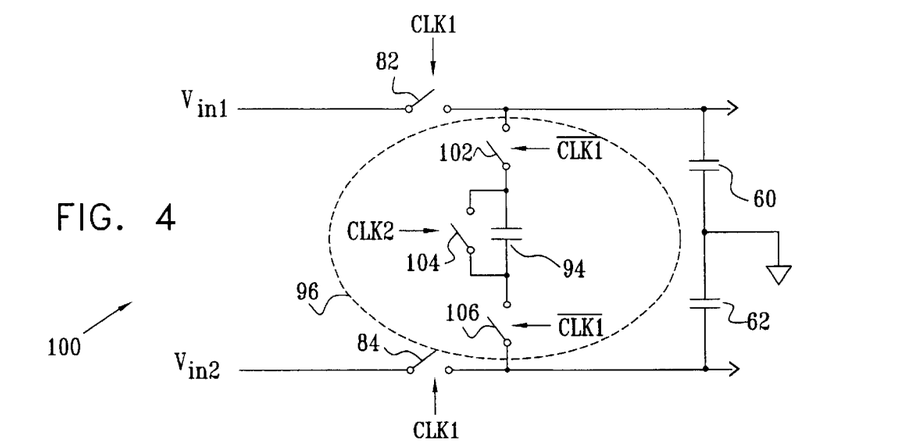
FIG. 4 is an equivalent circuit of the circuit of FIG. 3, according to a preferred embodiment of the present invention.

Reference is now made to FIGS. 3 and 4, which are a schematic electronic diagram of a switched capacitor circuit 50, and an equivalent circuit 100 of circuit 50, according to a preferred embodiment of the present invention. Circuit 50 is preferably implemented as part of a very large scale integrated circuit (VLSI), most preferably using metal oxide semiconductor (MOS) technology. Circuit 50 comprises an n-channel MOS (NMOS) transistor 52 connected in parallel to a p-channel MOS (PMOS) transistor 54, so that the drains of both transistors are connected at a node 64, and so that the sources of both transistors are connected at a node 68. Transistors 52 and 54 function as a transmission gate switch 82. Circuit 50 also comprises an n-channel MOS (NMOS) transistor 58 connected in parallel to a p-channel MOS (PMOS) transistor 56, so that their drains are connected at a node 66 and their sources at a node 70. Transistors 56 and 58 function as a transmission gate switch 84. Node 64 is connected to a conductor 65, and node 66 is connected to a conductor 67. A first load capacitor 60 is connected between conductor 65 and ground, and a second load capacitor 62 is connected between conductor 67 and ground. As explained in more detail below, switches 82 and 84 act as respective charging switches for capacitors 60 and 62.

Circuit 50 is a differential circuit which accepts differential voltages $V_{in1}$ and $V_{in2}$ at nodes 68 and 70 respectively. Voltages $V_{in1}$ and $V_{in2}$ are assumed to be in a range $V_L < V_{in1}$, $V_{in2} < V_H$, wherein $V_L$ is a lower limit and $V_H$ is an upper limit for $V_{in1}$, $V_{in2}$. Most preferably, $V_L$ and $V_H$ are substantially equidistant from a lower rail voltage $V_{ee}$ and an upper rail voltage $V_{dd}$. For example, if $V_{dd}$=2.5 V and $V_{ee}$=0 V, a set of values for $V_L$ and $V_H$ may be $V_L$=0.75 V and $V_H$=1.75 V.

A mean value $V_m$ of $V_L$ and $V_H$ is:

$$V_m = \frac{(V_L + V_H)}{2} \tag{1}$$

$V_{in1}$ and $V_{in2}$ are then set, by methods which are well known in the art, so that respective differences between $V_{in1}$, $V_{in2}$ and $V_m$ are equal and opposite, i.e., so that:

$$V_{in1} - V_m = -(V_{in2} - V_m) \tag{2}$$

Transistors 52 and 54 comprise respective gates 72 and 74, and an effective area of each of the gates can be adjusted when the transistors are implemented. The area of each of the gates is preferably set so that, as described in the Background of the Invention, charge injection cancellation substantially occurs at a value $V_m$. Similarly, transistors 56 and 58 comprise respective gates 76 and 78, and the effective area of each of these gates is adjusted at implementation so that charge injection cancellation also substantially occurs at a value $V_m$.

In operation, a primary clock CLK1 drives gates 72 and 78, and an inverse clock $\overline{CLK1}$ drives gates 54 and 56, substantially as described in the Background of the Invention.

Circuit 50 comprises a charge cancellation sub-circuit 96, which acts to reduce charge injection error still present when switches 82 and 84 switch off and generate injection error charges. Sub-circuit 96 comprises a first NMOS transistor 86 and a second NMOS transistor 88, acting as respective isolation switches 102 and 106. Sub-circuit 96 further comprises a PMOS transistor 92 and an NMOS transistor 90 connected in parallel, acting as a transmission gate discharge switch 104. Switches 102, 104, and 106 are connected in series between conductor 65 and conductor 67. Switches 102, 104, and 106, and their corresponding transistors, thus act as switching circuitry in circuits 50 and 100. A compensating capacitor 94 is implemented in parallel with switch 104; capacitor 94 is preferably formed as a combined source-drain capacitance of transistors 90 and 92 when the latter are implemented, indicated by showing capacitor 94 in FIG. 2 as dashed lines. Alternatively or additionally, capacitor 94 is implemented partly or wholly as a separate element.

Transistors 86 and 88 (switches 102 and 106 respectively) are driven by substantially the same clock signals as drive switches 82 and 84. However, switches 82 and 84 operate in anti-phase to switches 102 and 106. Thus, when switches 82 and 84 are open, switches 102 and 106 are closed; when switches 82 and 84 are closed, switches 102 and 106 are open. Transistors 90 and 92 (switch 104) are driven by secondary clocks CLK2 and $\overline{\text{CLK2}}$, so that switch 104 is generally in phase with switches 82 and 84, except for differences described below with respect to FIG. 5.

Figure 5:
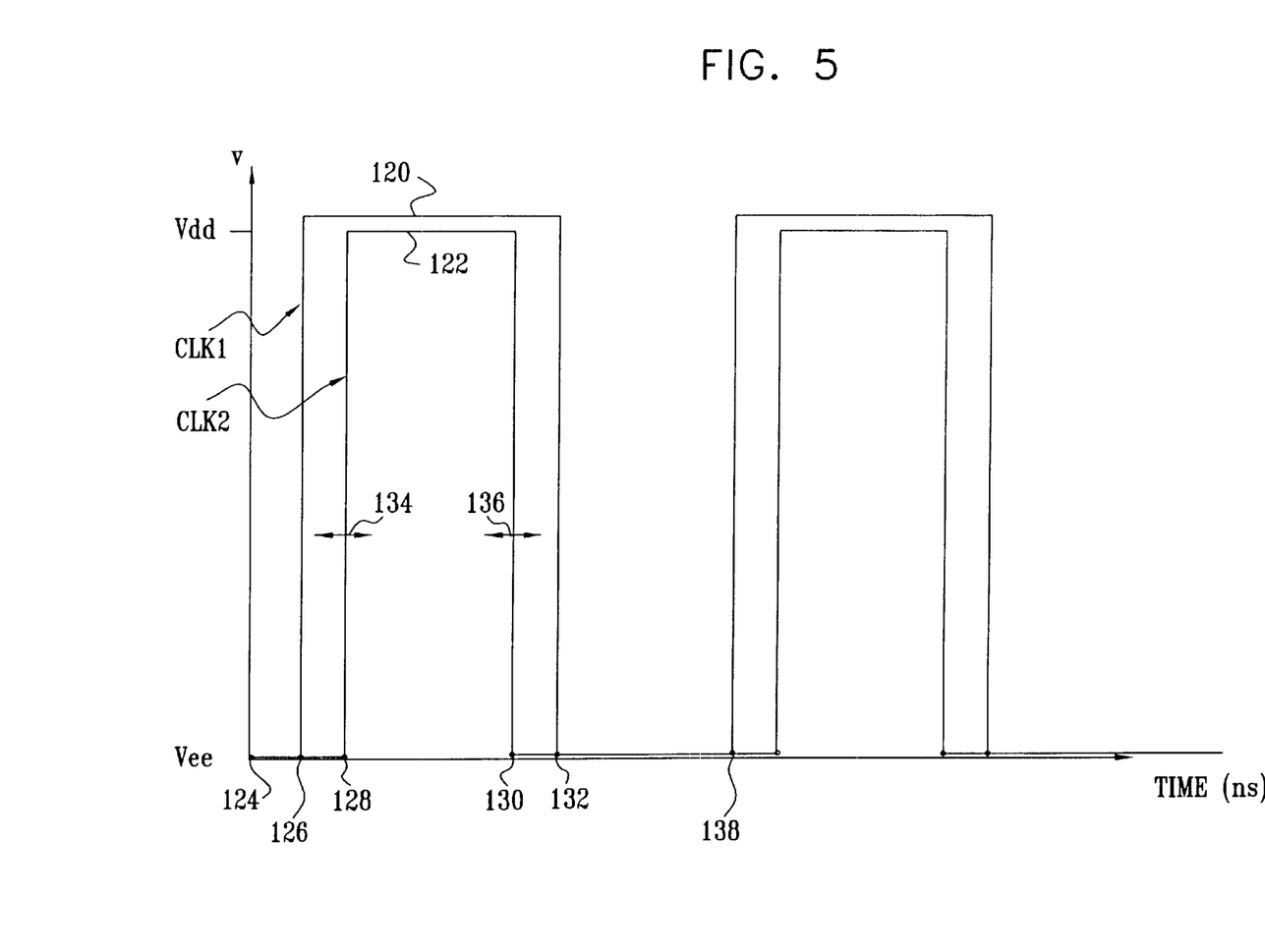
FIG. 5 is a graph showing a relationship between clock signals CLK1 and CLK2 for the circuits of FIG. 3 and FIG. 4, according to a preferred embodiment of the present invention.

FIG. 5 is a graph showing a relationship between clock signals CLK1 and CLK2 for circuits 50 and 100, according to a preferred embodiment of the present invention. A clock signal 120 shows a waveform for CLK1, which has an approximate duty cycle of 50% and a period of approximately 20 ns, although it will be appreciated that this duty cycle and period are by way of example, and preferred embodiments of the present invention may use clocks with other duty cycles and periods. A clock signal 122 shows a waveform for CLK2, which has substantially the same period as CLK1, but a shorter duty cycle.

At a time 124, switches 82 and 84 are open so that circuit 50 is not coupled to incoming voltages $V_{in1}$ and $V_{in2}$. Also at time 124, switches 102 and 106 are closed, and switch 104 is open. At a time 126, CLK goes high so that switches 82 and 84 close and switches 102 and 106 open. Capacitors 60 and 62 are thus coupled to $V_{in1}$ and $V_{in2}$, and begin charging to these voltages, so that switches 82 and 84 act as respective charging switches for the capacitors. At some time 128, after time 126, CLK2 goes high so that switch 104 closes, discharging any charge which may be on capacitor 94. At some time 130 after time 128, while switches 86 and 88 are still open, CLK2 goes low, so that switch 104 opens and so that capacitor 94 is able to receive and store charge. At a time 132 CLK1 goes low, so that switches 82 and 84 open and switches 102 and 106 close. Time 132 is a time when injection charges on gates of transistors corresponding to switches 82 and 84 normally charge capacitors 60 and 62, in the absence of capacitor 94. Since capacitor 94 is present and is coupled to switches 82 and 84, it preferentially accepts the injection charges, so that the injection charge error potential formed on capacitors 60 and 62 becomes close to zero.

Circuit 50 continues in a state where switches 82, 84, and 104 are open, and switches 102 and 106 are closed, until a time 138, corresponding to time 126, when the cycle of events described above repeats. Because of the essentially zero injection charge error, potentials on capacitor 60 and 62 during the time interval between time 132 and time 138 are substantially equal to $V_{in1}$ and $V_{in2}$.

It will be understood from the description above that switches 82 and 84 toggle substantially in anti-phase to switches 102 and 106, and, apart from the difference in duty cycle, generally in phase with switch 104. Furthermore, times for opening and closing of switch 104 are not critical. Substantially the only conditions on switch 104 are that it is closed during a period when switches 102 and 106 are open, so that capacitor 94 discharges, and that it is open when capacitor 94 needs to accept the injection charges from switches 82 and 84. Thus, as illustrated by arrows 134 and 136, times 128 and times 130 may vary appreciably, so long as the conditions above are obeyed.

Returning to FIG. 3, a value of compensating capacitor 94 that sets the injection charge error potential to be substantially zero is dependent on other parameters of the circuit. An instantaneous change in voltage $dV_1$ on conductor 65 is given by:

$$dV_1 = \frac{dQ_1 + dQ_{com}}{C_{load}} \quad (3)$$

wherein $dQ_1$ is a charge injected by switch 82 to conductor 65, $dQ_{com}$ is a charge on capacitor 94, and $C_{load}$ is a capacitance of capacitor 60.

Similarly, an instantaneous change in voltage $dV_2$ on conductor 67 is given by:

$$dV_2 = \frac{dQ_2 - dQ_{com}}{C_{load}} \quad (4)$$

wherein $dQ_2$ is a charge (opposite in sign to $dQ_1$) infected by switch 84 to conductor 67, $dQ_{com}$ is the charge on capacitor 94, and $C_{load}$ is a capacitance of capacitor 62, herein assumed to be substantially equal to the capacitance of capacitor 60.

In order to cancel the differential voltage error, we require that the differentials $dV_1$ and $dV_2$ be substantially equal, $$dV_1 - dV_2 = 0 \quad (5)$$

Thus, substituting equations (3) and (4) into equation (5) gives $dQ_1 - dQ_2 - 2dQ_{com} = 0$, which rearranges to:

$$dQ_{com} = -\frac{dQ_1 - dQ_2}{2} \quad (6)$$

If a channel capacitance for each transistor 52, 54, 56, and 58 is assumed to be $C_g$, and that the absolute threshold voltages for NMOS and PMOS transistors are substantially equal, and if it is assumed that charge leakage from each channel is substantially evenly divided between the source and the drain of each transistor, it can be shown from basic MOS equations that:

$$dQ_1 = C_g \cdot \Delta V \text{ and } dQ_2 = -C_g \cdot \Delta V \text{ where } \Delta V = V_{in1} - V_m = V_m - V_{in2} \quad (7)$$

and Vm is defined in equation (1).

The charge $dQ_{com}$ that flows through charge cancellation capacitor 94 is given by $$dQ_{com} = -C_{com} \cdot 2\Delta V \quad (8)$$

where $C_{com}$ is the capacitance of capacitor 94, since capacitor 94 is switched between the voltages $V_{in1}$ and $V_{in2}$ which differ by $2\Delta V$.

Thus, comparing equations (7) and (8), the capacitance of capacitor 94, $C_{com}$, is given by:

$$C_{com} = \frac{1}{2} C_g \qquad (9)$$

Since the value of capacitor 94 from equation (9) is relatively small, it will be appreciated that capacitor 94 may be implemented by adjusting a parasitic source-drain capacitance of transistors 90 and/or 92 to be substantially equal to ½$C_g$. Alternatively, capacitor 94 is implemented at least in part by an element distinct from transistors 90 and 92.

Figure 6:
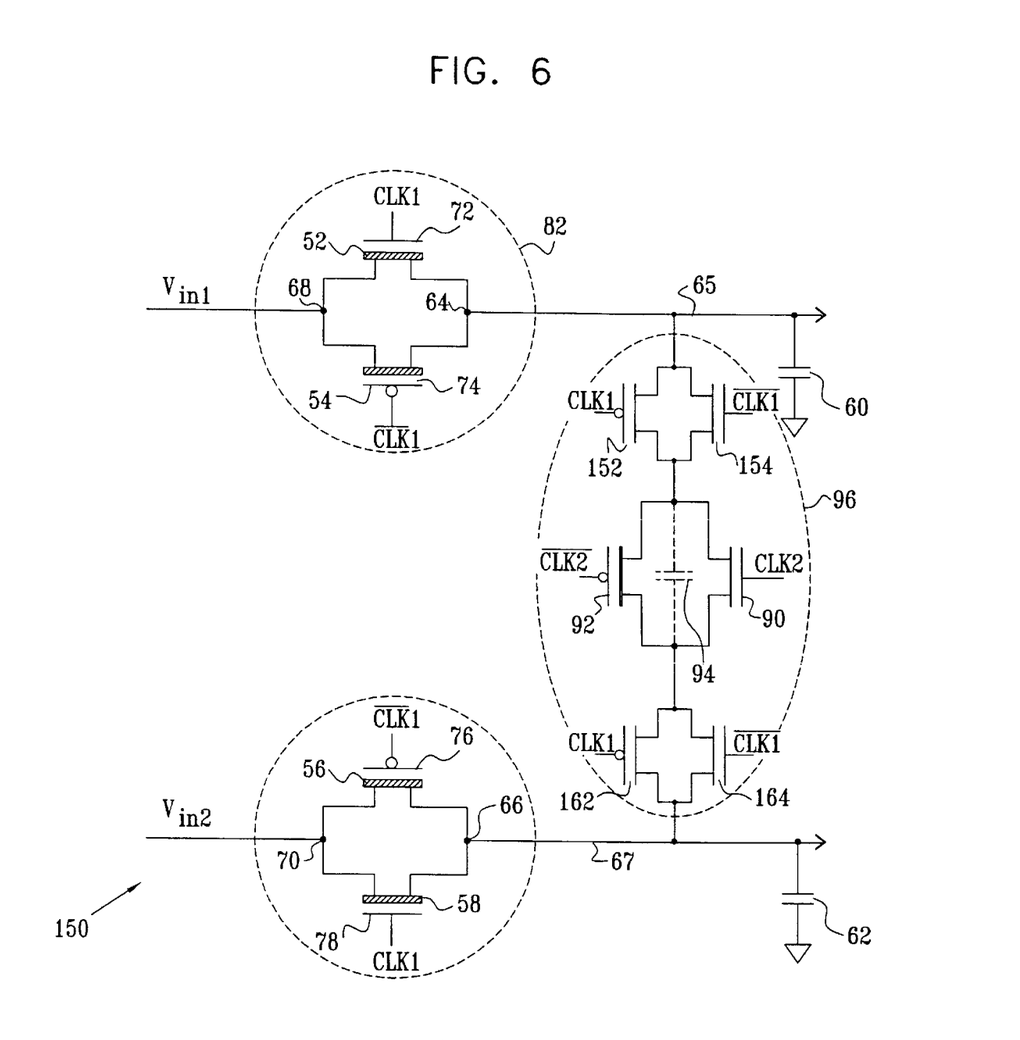
FIG. 6 is a schematic electronic diagram of an alternative switching capacitor circuit, according to a preferred embodiment of the present invention.

FIG. 6 is a schematic electronic diagram of an alternative switching capacitor circuit 150, according to a preferred embodiment of the present invention. Apart from the differences described below, the operation of circuit 150 is generally similar to that of circuit 50 (FIG. 3), so that elements indicated by the same reference numerals in both circuits 50 and 150 are generally identical in construction and in operation, and equivalent circuit 100 (FIG. 4) applies to circuit 150.

Sub-circuit 96 comprises a PMOS transistor 152 and an NMOS transistor 154 connected in parallel, in place of transistor 86, so that switch 102 is implemented as a transmission gate switch. Transistors 152 and 154 receive clock signals CLK1 and $\overline{\text{CLK1}}$ respectively, so that switch 102 switches, as described above for circuit 50, in anti-phase with switches 82 and 84. Sub-circuit 96 also comprises a PMOS transistor 162 and an NMOS transistor 164 connected in parallel, in place of transistor 88, so that switch 106 is implemented as a transmission gate switch.

It will be understood that in both circuits 50 and 150 transistors which are implemented to form switches 102, 104, and 106 in sub-circuit 96 do not have to conform to constraints applying to switches 82 and 84. In particular, since the switches in sub-circuit 96 need to transport currents significantly smaller than those transported by switches 82 and 84, the sub-circuit switches can be significantly smaller than switches 82 and 84.

Figure 7A:
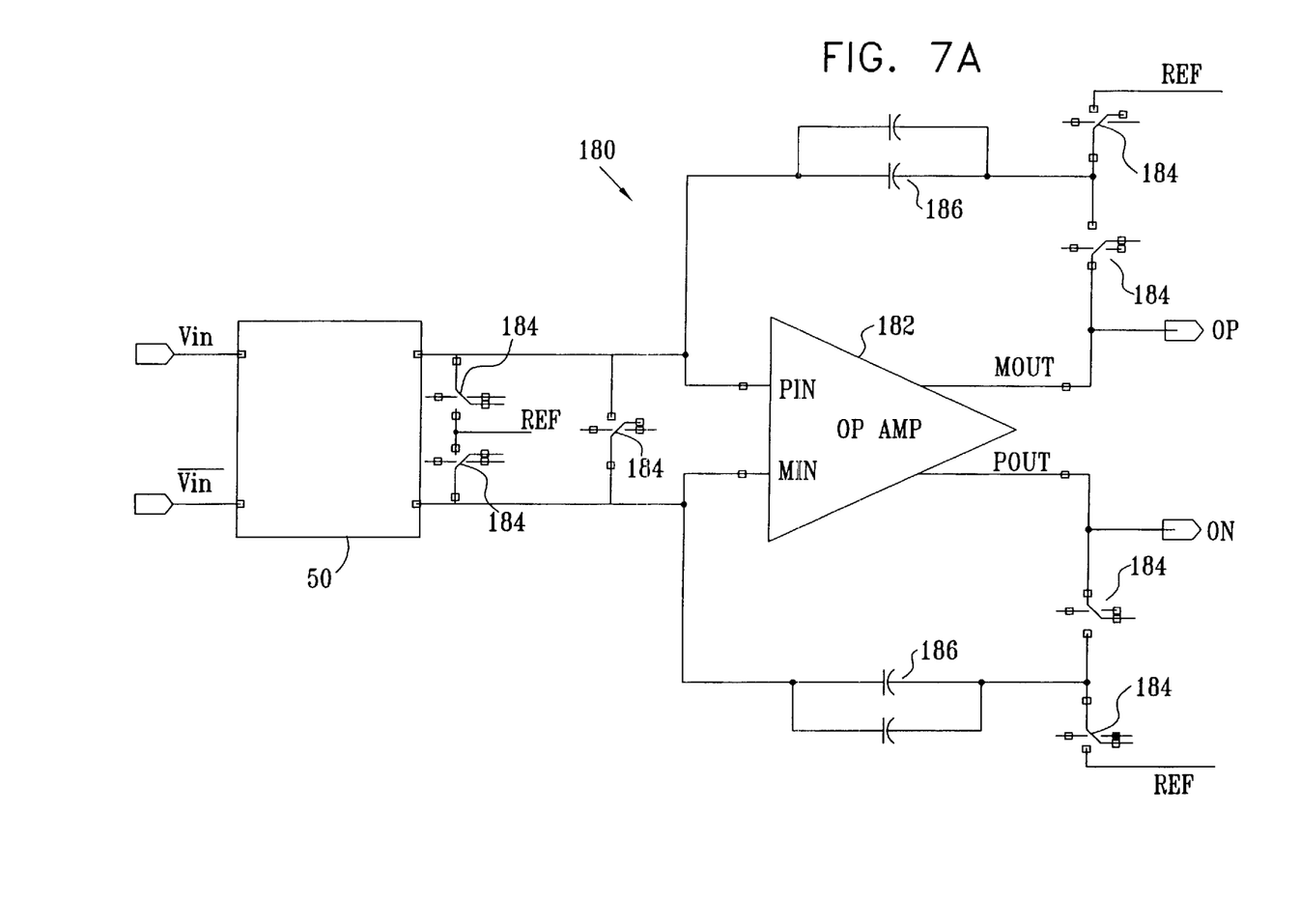
FIG. 7A is a schematic block diagram of a circuit using the switching capacitor circuit of FIG. 3, according to a preferred embodiment of the present invention.
Figure 7B:
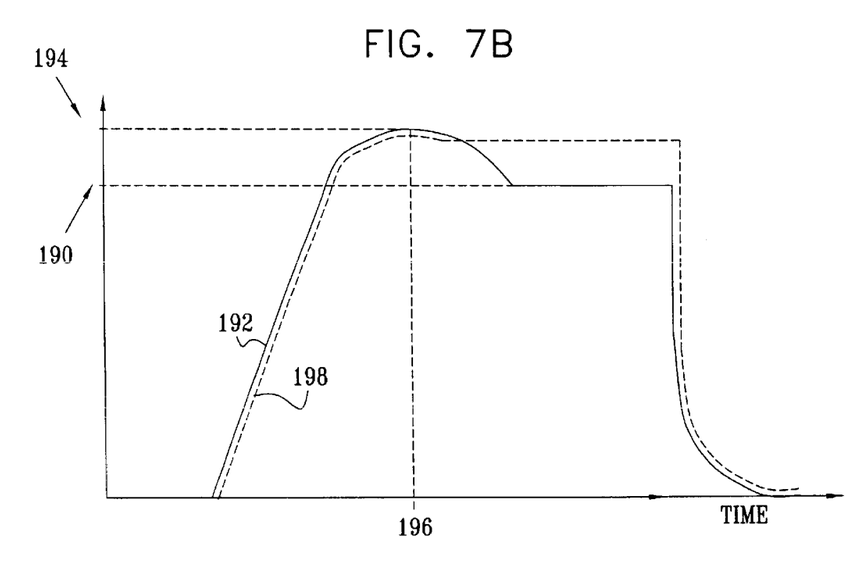
FIG. 7B is an output graph of the circuit of FIG. 7A, according to a preferred embodiment of the present invention.

FIG. 7A is a schematic block diagram of a circuit 180 using switched capacitor circuit 50, and FIG. 7B is an output graph of circuit 180, according to a preferred embodiment of the present invention. Circuit 180 comprises circuit 50, which has its output voltages coupled to an operational amplifier 182. Circuit 180 further comprises switches 184 and capacitors 186, so that circuit 180 operates as a sample and hold amplifier. A graph 192 (FIG. 7B) shows an output of circuit 180. A level 190 corresponds to a voltage input to circuit 180. At a time 196, switches 82 and 84 switch off, so generating injection error charges. The charges transfer to capacitor 94, wherein they are stored, and a voltage output by circuit 180 drops from a level 194 to a level substantially equal to level 190. For comparison, a graph 198 shows an output when circuit 180 does not have a sub-circuit 96 implemented in circuit 50. Graph 198 has an output substantially equal to level 194, which is approximately 2.4 mV higher than input level 190.

Although the preferred embodiments described above are based on differential circuits, the principles of the present invention are also applicable to non-differential circuits. In this case, however, it becomes necessary to duplicate the circuit so that there are still two transmission gates 82 and 84 (FIGS. 3 and 4) and two complementary input voltages $V_{in1}$ and $V_{in2}$. The output of capacitor 60 is then used as the non-differential output which tracks the input voltage $V_{in1}$ with virtually no charge injection error. This result is correct for the complete voltage range ($V_L < V_{in1} < V_H$) if transmission gates 82 and 84 are designed to have exact charge cancellation at the input voltage $V_m$ given in equation (1).

It will be appreciated that the preferred embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

What is claimed is:

1. A switched capacitor circuit, comprising:

a load-capacitor;

a charging switch, which is coupled to apply a potential to the load-capacitor;

a compensating-capacitor; and switching circuitry, which is coupled to the charging switch and the compensating-capacitor and is switchable so as to transfer to the compensating-capacitor an injection error charge produced by the charging switch, and then to isolate the injection error charge on the compensating-capacitor from the load-capacitor, wherein the switching circuitry comprises an isolation switch which isolates the injection error charge from the load-capacitor; and a clock which toggles the charging switch and the isolation switch substantially in anti-phase.

2. A circuit according to claim 1, wherein the charging switch comprises a transmission gate switch.

3. A circuit according to claim 1, wherein the compensating-capacitor comprises a parasitic capacitance of the switching circuitry.

4. A circuit according to claim 1, wherein the switching circuitry comprises at least one transmission gate switch.

5. A circuit according to claim 1, wherein the switching circuitry comprises at least one metal oxide semiconductor (MOS) transistor.

6. A switched capacitor circuit, comprising:

a load-capacitor;

a charging switch, which is coupled to apply a potential to the load-capacitor;

a compensating-capacitor; and switching circuitry, which is coupled to the charging switch and the compensating-capacitor and is switchable so as to transfer to the compensating-capacitor an injection error charge produced by the charging switch, and then to isolate the injection error charge on the compensating-capacitor from the load-capacitor, wherein the switching circuitry comprises a discharge switch which discharges the compensating-capacitor;

a first clock which toggles the charging switch; and a second clock which toggles the discharge switch substantially in phase with the charging switch, wherein the second clock comprises a second duty cycle less than a first duty cycle of the first clock.

7. A switched capacitor circuit, comprising:

a load-capacitor;

a charging switch, which is coupled to apply a potential to the load-capacitor;

a compensating-capacitor; and switching circuitry, which is coupled to the charging switch and the compensating-capacitor and is switchable so as to transfer to the compensating an injection error charge produced by the charging switch and then to isolate the injection error charge on the compensating-capacitor from the load-capacitor, wherein the charging switch comprises a transistor having a gate-capacitance, and wherein a compensating-capacitor-capacitance of the compensating-capacitor is substantially equal to half the gate-capacitance of the transistor.

8. A method for reducing error in a switched capacitor circuit, comprising:

coupling a charging switch to apply a potential to a load-capacitor; and switching a compensating-capacitor into electrical communication with the charging switch so as to store on the compensating-capacitor an injection error charge produced by the charging switch, thus isolating the injection error charge from the load-capacitor, wherein switching the compensating-capacitor comprises coupling an isolation switch to the charging switch, and isolating the compensating-capacitor from the load-capacitor with the isolation switch, wherein coupling the isolation switch comprises toggling the charging switch and the isolation switch substantially in anti-phase.

9. A method according to claim 8, wherein the compensating-capacitor comprises a parasitic capacitance of switching circuitry which is adapted to switch the compensating-capacitor.

10. A method according to claim 9, wherein the switching circuitry comprises at least one transmission gate switch.

11. A method according to claim 9, wherein the switching circuitry comprises at least one metal oxide semiconductor (MOS) transistor.

12. A method for reducing error in a switched capacitor circuit, comprising:

coupling a charging switch to apply a potential to a load-capacitor; and switching a compensating-capacitor into electrical communication with the charging switch so as to store on the compensating-capacitor an injection error charge produced by the charging switch, thus isolating the injection error charge from the load-capacitor, wherein switching the compensating-capacitor comprises coupling a discharge switch to the compensating-capacitor, and discharging the compensating-capacitor with the discharge switch;

toggling the charging switch with a first clock; and toggling the discharge switch substantially in phase with the charging switch with a second clock, wherein the second clock comprises a second duty cycle less than a first duty cycle of the first clock.

13. A differential switched capacitor circuit, comprising:

a first load-capacitor;

a first charging switch, which is coupled to apply a first differential potential to the first load-capacitor;

a second load-capacitor;

a second charging switch, which is coupled to apply a second differential potential to the second load-capacitor;

a compensating-capacitor; and switching circuitry, which is coupled to the first charging switch and the second charging switch and the compensating-capacitor, and is switchable so as to transfer to the compensating-capacitor a first injection error charge produced by the first charging switch and a second injection error charge produced by the second charging switch, and then to isolate the first injection error charge and the second injection error charge on the compensating-capacitor from the first and second load-capacitors.

14. A circuit according to claim 13, wherein the switching circuitry comprises a plurality of isolation switches which isolate the first and second injection error charges from the first and second load-capacitors.

15. A circuit according to claim 14, and comprising a clock which toggles the first and second charging switches substantially in anti-phase to the plurality of isolation switches.

16. A circuit according to claim 13, wherein the switching circuitry comprises a discharge switch which discharges the compensating-capacitor.

17. A circuit according to claim 16, and comprising a first clock which toggles the first and second charging switches and a second clock which toggles the discharge switch substantially in phase with the first and second charging switches, wherein the second clock comprises a second duty cycle less than a first duty cycle of the first clock.

18. A circuit according to claim 13, wherein at least one of the first and second charging switches comprises a transmission gate switch.

19. A circuit according to claim 13, wherein the compensating-capacitor comprises a parasitic capacitance of the switching circuitry.

20. A circuit according to claim 13, wherein at least one of the first and second charging switches comprises a transistor having a gate-capacitance, and wherein a compensating-capacitor-capacitance of the compensating-capacitor is substantially equal to half the gate-capacitance of the transistor.

21. A circuit according to claim 13, wherein the switching circuitry comprises at least one transmission gate switch.

22. A circuit according to claim 13, wherein the switching circuitry comprises at least one metal oxide semiconductor (MOS) transistor.

23. A circuit according to claim 13, wherein the first and second injection error charges are substantially equal in magnitude.

24. A circuit according to claim 23, wherein the first and the second differential potential are substantially equal in magnitude, and wherein the magnitude of the first and the second differential potential comprises a value between 0 V and a predetermined function of one or more rail voltages supplying the circuit.

25. A method for reducing error in a differential switched capacitor circuit, comprising:

coupling a first charging switch to apply a first differential potential to a first load-capacitor;

coupling a second charging switch to apply a second differential potential to a second load-capacitor; and switching a compensating-capacitor into electrical communication with the first and second charging switches so as to store on the compensating-capacitor a first injection error charge produced by the first charging switch and a second injection error charge produced by the second charging switch, thus isolating the first and second injection error charges from the first and second load-capacitors.

26. A method according to claim 25, wherein switching the compensating-capacitor comprises isolating the first and second injection error charges from the first and second load-capacitors with a plurality of isolation switches.

27. A method according to claim 26, wherein isolating the first and second injection error charges comprises toggling the first and second charging switches substantially in antiphase to the plurality of isolation switches.

28. A method according to claim 25, wherein switching the compensating-capacitor comprises coupling a discharge switch to the compensating-capacitor and discharging the compensating-capacitor with the discharge switch.

29. A method according to claim 28, and comprising toggling the first and second charging switches with a first clock and toggling the discharge switch substantially in phase with the first and second charging switches with a second clock, wherein the second clock comprises a second duty cycle less than a first duty cycle of the first clock.

30. A method according to claim 25, wherein the compensating-capacitor comprises a parasitic capacitance of switching circuitry which is adapted to switch the compensating-capacitor.

31. A method according to claim 30, wherein the switching circuitry comprises at least one transmission gate switch.

32. A method according to claim 30, wherein the switching circuitry comprises at least one metal oxide semiconductor (MOS) transistor.

33. A method according to claim 25, wherein the first and second injection error charges are substantially equal in magnitude.

34. A method according to claim 33, wherein the first and the second differential potential are substantially equal in magnitude, and wherein the magnitude of the first and the second differential potential comprises a value between 0 V and a predetermined function of one or more rail voltages supplying the circuit.

* * * * *